(12) United States Patent
Do

(10) Patent No.: US 9,135,960 B2
(45) Date of Patent: Sep. 15, 2015

(54) SIGNAL RECEIVER CIRCUIT

(71) Applicant: SK hynix Inc., Icheon-si Gyeonggi-do (KR)

(72) Inventor: Chang Ho Do, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/024,799

(22) Filed: Sep. 12, 2013

(65) Prior Publication Data

US 2014/0300392 A1    Oct. 9, 2014

(30) Foreign Application Priority Data

Apr. 4, 2013    (KR) .................. 10-2013-0037081

(51) Int. Cl.
  *G11C 5/14*    (2006.01)
  *G05F 1/565*    (2006.01)
  *G11C 29/12*    (2006.01)
  *G11C 29/46*    (2006.01)

(52) U.S. Cl.
  CPC .............. *G11C 5/147* (2013.01); *G05F 1/565* (2013.01); *G11C 29/12005* (2013.01); *G11C 29/46* (2013.01)

(58) Field of Classification Search
  CPC ..... H01L 27/0262; H03K 17/163; G11C 5/04
  USPC .......................................... 327/108, 109, 112
  See application file for complete search history.

(56) References Cited

U.S. PATENT DOCUMENTS

2009/0045796 A1*    2/2009    Kang et al. .................... 323/318
2010/0008001 A1*    1/2010    Do ................................. 361/56
2011/0248876 A1    10/2011    Wikner

FOREIGN PATENT DOCUMENTS

KR    1020070056444 A    6/2007

* cited by examiner

*Primary Examiner* — John Poos
(74) *Attorney, Agent, or Firm* — William Park & Associates Ltd.

(57) ABSTRACT

The signal receiver circuit includes a selection signal generator generating first and second selection signals in response to at least one of an electrical open/short state of a fuse and test mode signals, an internal reference voltage generator amplifying an external reference voltage signal after reducing static electricity created by the external reference voltage signal to generate a plurality of internal voltage signals and generating an internal reference voltage signal using the plurality of internal voltage signals in response to the first and second selection signals, and a buffer buffering an internal signal in response to the internal reference voltage signal to generate a control signal for controlling an internal circuit.

17 Claims, 7 Drawing Sheets

SIGNAL RECEIVER CIRCUIT

CROSS-REFERENCE TO RELATED APPLICATION

The present application claims priority under 35 U.S.C 119(a) to Korean Application No. 10-2013-0037081, filed on Apr. 4, 2013, in the Korean Intellectual Property Office, which is incorporated herein by reference in its entirety.

BACKGROUND

In general, a signal receiver circuit in an integrated circuit (IC) such as a semiconductor device may receive a reference voltage signal and a plurality of input signals from an external device and amplify the input signals. The signal receiver circuit may compare the input signals with the reference voltage signal to generate a control signal for controlling an internal circuit included in the IC. The control signal may have a logic level which is determined according to a comparison result of the input signals and the reference voltage signal. For example, the control signal may be set to have a logic "high" level when a logic level of the input signal is higher than that of the reference voltage signal and the control signal may be set to have a logic "low" level when a logic level of the input signal is lower than that of the reference voltage signal. The reference voltage signal inputted to the signal receiver circuit should be set to have a median level between a predetermined maximum level (VILmax) and a predetermined minimum level (VILmin). However, the reference voltage signal may vary depending on the circumstance. For example, the reference voltage signal may have an abnormal level due to an environment condition, noises of power signals of a system, interconnection shapes of a printed circuit board (PCB) and/or interconnection shapes of a package device. If the reference voltage signal has an abnormal level, the signal receiver circuit may incorrectly recognize a level of the input signal to generate an erroneous control signal having an incorrect logic level and to cause a malfunction of the internal circuit. Thus, it may be necessary to accurately adjust or minimize a level fluctuation of the reference voltage signal in order to prevent a malfunction of the semiconductor IC.

SUMMARY

Various embodiments are directed to signal receiver circuits.

According to an embodiment, a signal receiver circuit includes an internal reference voltage generator, and a buffer. The selection signal generator is configured to generate first and second selection signals in response to at least one of an electrical open/short state of a fuse and test mode signals. The internal reference voltage generator is configured to amplify an external reference voltage signal after reducing static electricity created by the external reference voltage signal to generate a plurality of internal voltage signals. In addition, the internal reference voltage generator is configured to generate an internal reference voltage signal using the plurality of internal voltage signals in response to the first and second selection signals. The buffer is configured to buffer an internal signal in response to the internal reference voltage signal to generate a control signal for controlling an internal circuit.

According to an embodiment, a signal receiver circuit includes electrostatic discharging protector, a reference voltage controller, a unit gain buffer, a selection output portion, and a buffer. The electrostatic discharging protector is configured to reduce static electricity created by an external reference voltage signal to generate a first internal voltage signal. The reference voltage controller is configured to amplify the first internal voltage signal to generate at least two divided voltage signals. Further, the reference voltage controller is configured to output one of the at least two divided voltage signals as a second internal voltage signal in response to a first selection signal. The unit gain buffer is configured to buffer the second internal voltage signal to generate a third internal voltage signal. The selection output portion is configured to output one of the first and third internal voltage signals as an internal reference voltage signal in response to a second selection signal. The buffer is configured to generate a control signal for controlling an internal circuit in response to the internal signal and the internal reference voltage signal to.

According to an embodiment, a signal receiver circuit includes an electrostatic discharging protector, a reference voltage controller, a selection output portion, a unit gain buffer and a buffer. The electrostatic discharging protector is configured to reduce static electricity created by an external reference voltage signal to generate a first internal voltage signal. The reference voltage controller is configured to amplify the first internal voltage signal to generate at least two divided voltage signals. Further, the reference voltage controller is configured to output one of the at least two divided voltage signals as a second internal voltage signal in response to a first selection signal. The selection output portion is configured to output one of the first and second internal voltage signals as a third internal voltage signal in response to a second selection signal. The unit gain buffer is configured to buffer the third internal voltage signal to generate an internal reference voltage signal. The buffer is configured to buffer an internal signal in response to the internal reference voltage signal to generate a control signal for controlling an internal circuit.

BRIEF DESCRIPTION OF THE DRAWINGS

Embodiments of the inventive concept will become more apparent in view of the attached drawings and accompanying detailed description, in which.

DETAILED DESCRIPTION

Various embodiments of the inventive concept will be described hereinafter with reference to the accompanying drawings. However, the various embodiments described herein are for illustrative purposes only and are not intended to limit the scope of the inventive concept.

Figure 1:
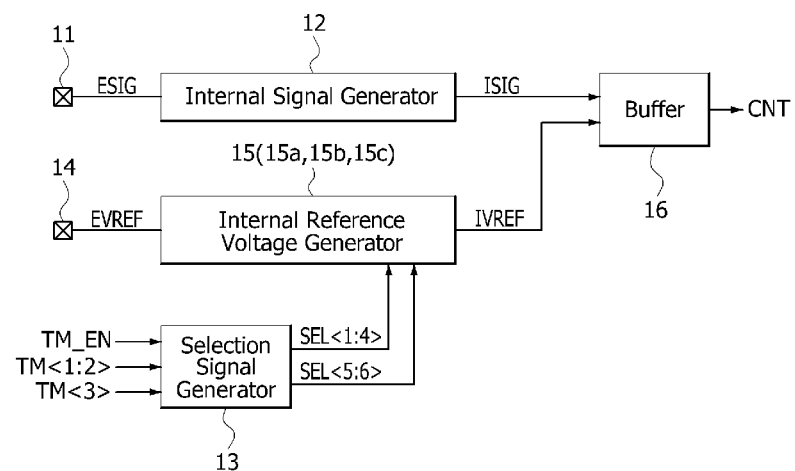
FIG. 1 is a block diagram illustrating a configuration of a signal receiver circuit according to an embodiment of the present invention.

Referring to FIG. 1, a signal receiver circuit according to an embodiment of the present invention may be configured to include a first pad 11, an internal signal generator 12, a selection signal generator 13, a second pad 14, an internal reference voltage generator 15 (e.g., 15a, 15b or 15c), and a buffer 16. The internal signal generator 12 may receive an external signal ESIG through the first pad 11 to generate an internal signal ISIG. The internal signal generator 12 may be a buffer that buffers the external signal ESIG to generate the internal signal ISIG. The selection signal generator 13 may generate first selection signals SEL<1:4> and second selection signals SEL<5:6> in response to test mode signals TM<1:3>. In addition, although not shown in the drawings, the selection signal generator 13 may generate first selection signals SEL<1:4> and second selection signals SEL<5:6> according to an electrical open/short state of a fuse (e.g. whether or not the fuse has blown). When a test mode enable signal TM_EN is enabled, the selection signal generator 13 may decode the test mode signals TM<1:2> to generate the first selection signals SEL<1:4> including a bit which is selectively enabled. Further, the selection signal generator 13 may generate the second selection signals SEL<5:6> including a bit which is selectively enabled according to the test mode signal TM<3>. In an embodiment of the present invention, the selection signal generator 13 may decode the test mode signals TM<1:2> to generate the first and second selection signals SEL<1:6> during a test mode and may generate the first and second selection signals SEL<1:6> according to an electrical open/short state of a fuse when the test mode terminates. The internal reference voltage generator 15 (e.g., 15a, 15b or 15c) may amplify an external reference voltage signal EVREF after reducing the static electricity created by the external reference voltage signal EVREF supplied from an external device through the second pad 14 and may generate an internal reference voltage signal IVREF whose level is controlled in response to the first selection signals SEL<1:4> and the second selection signals SEL<5:6>. The buffer 16 may buffer the internal signal ISIG in response to the internal reference voltage signal IVREF to generate a control signal CNT for controlling an internal circuit (not shown). The buffer 16 may generate the control signal CNT having a logic "high" level when the internal signal ISIG have a higher level than the internal reference voltage signal IVREF. By contrast, the buffer 16 may generate the control signal CNT having a logic "low" level when the internal signal ISIG have a lower level than the internal reference voltage signal IVREF. The logic level of the control signal CNT may have a different setting other than the above. For example, in an embodiment of the present invention, the control signal CNT may be generated to have a logic "low" level when the internal signal ISIG have a higher level than the internal reference voltage signal IVREF, and the control signal CNT may be generated to have a logic "high" level when the internal signal ISIG have a lower level than the internal reference voltage signal IVREF.

Figure 2:
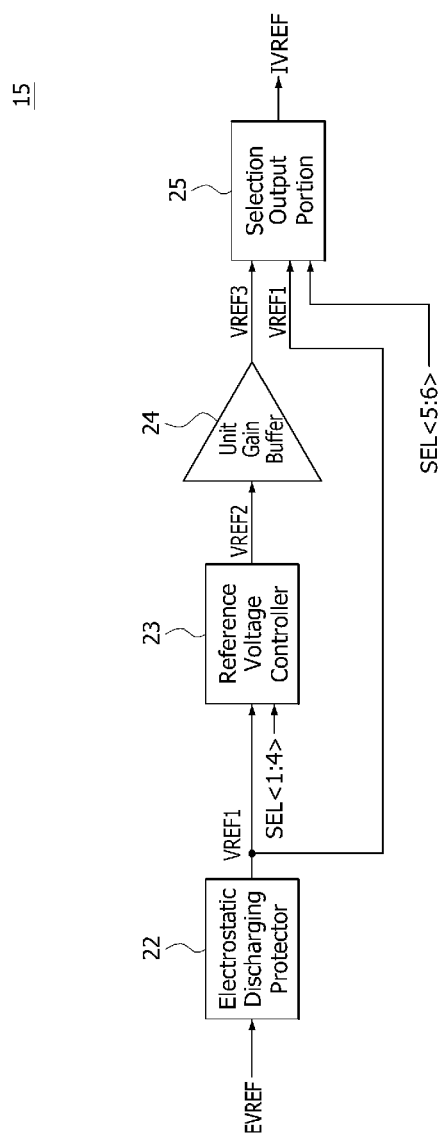
FIG. 2 is a block diagram illustrating an example of an internal reference voltage generator included in the signal receiver circuit of FIG. 1.

Referring to FIG. 2, the internal reference voltage generator may be configured to include an electrostatic discharging protector 22, a reference voltage controller 23, a unit gain buffer 24 and a selection output portion 25. The electrostatic discharging protector 22 acting as an input protection circuit may receive the external reference voltage signal EVREF to reduce the static electricity created by the external reference voltage signal EVREF and to generate a first internal voltage signal VREF1. When the external reference voltage signal EVREF does not create the static electricity, the electrostatic discharging protector 22 may output the external reference voltage signal EVREF as the first internal voltage signal VREF1. The reference voltage controller 23 may amplify the first internal voltage signal VREF1 in response to the first selection signals SEL<1:4> to output one of a plurality of the amplified voltage signals as a second internal voltage signal VREF2. The unit gain buffer 24 may buffer the second internal voltage signal VREF2 to output a third internal voltage signal VREF3. The selection output portion 25 may output one of the first and third internal voltage signals VREF1 and VREF3 as the internal reference voltage signal IVREF in response to the second selection signals SEL<5:6>.

Figure 3:
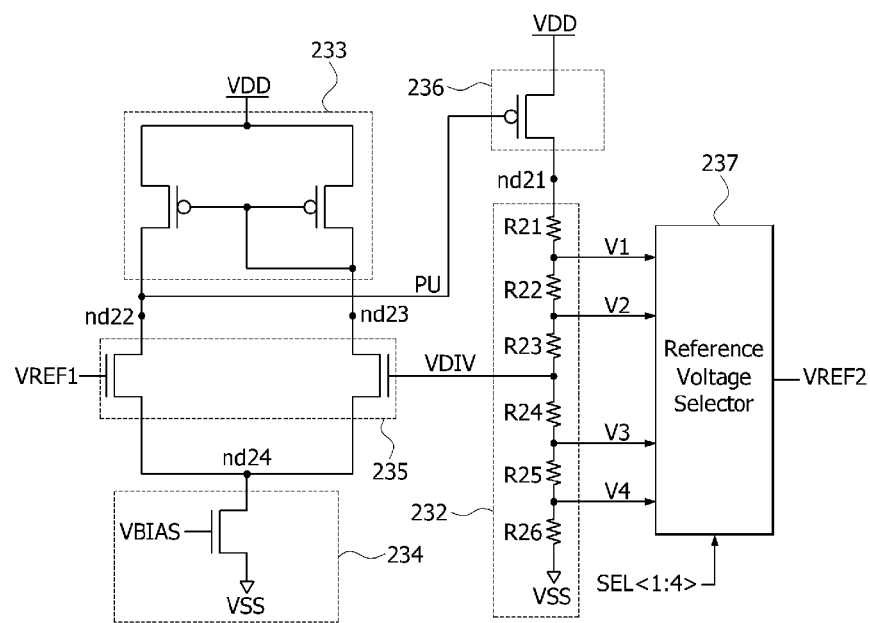
FIG. 3 is a schematic circuit diagram illustrating an example of a reference voltage controller included in the internal reference voltage generator of FIG. 2.

Referring to FIG. 3, the reference voltage controller 23 may configured to include a voltage divider 232, a current supplier 233, a current discharger 234, a signal input portion 235, a driver 236 and a reference voltage selector 237. The voltage divider 232 may include a plurality of resistive elements R21, R22, R23, R24, R25 and R26 and may divide a voltage level of an internal node ND21 to generate first to fourth divided voltage signals V1, V2, V3 and V4 and an input division voltage signal VDIV. The current supplier 233 may comprise a current mirror circuit to act as a constant current source that supplies currents to internal nodes ND22 and ND23. The current discharger 234 may receive a bias voltage signal VBIAS to discharge a current that flows through an internal node ND24. The bias voltage signal VBIAS may be set to have a different level according to an embodiment of the present invention. For example, in the event that the current discharger 234 comprises an NMOS transistor, the current flowing through the internal node ND24 may be discharged to a ground voltage terminal VSS when the bias voltage signal VBIAS has a logic "high" level. The signal input portion 235 may compare the input division voltage signal VDIV with the first internal voltage signal VREF1 to generate a pull-up signal PU outputted from the internal node ND22. In more detail, the signal input portion 235 may generate the pull-up signal PU having a logic "low" level when the first internal voltage signal VREF1 has a higher level than the input division voltage signal VDIV. The signal input portion 235 may generate the pull-up signal PU having a logic "high" level when the first internal voltage signal VREF1 has a lower level than the input division voltage signal VDIV. The driver 236 may drive the internal node ND21 so that the internal node ND21 have a power supply voltage VDD level when the pull-up signal PU having a logic "low" level is applied to the driver 236. The reference voltage selector 237 may output one of the first to fourth divided voltage signals V1, V2, V3 and V4 as the second internal voltage signal VREF2 in response to the first selection signals SEL<1:4>. For example, the reference voltage selector 237 may output the first divided voltage signal V1 as the second internal voltage signal VREF2 when only the signal SEL<1> among the first selection signals SEL<1:4> has a logic "high" level, the reference voltage selector 237 may output the second divided voltage signal V2 as the second internal voltage signal VREF2 when only the signal SEL<2> among the first selection signals SEL<1:4> has a logic "high" level, the reference voltage selector 237 may output the third divided voltage signal V3 as the second internal voltage signal VREF2 when only the signal SEL<3> among the first selection signals SEL<1:4> has a logic "high" level, and the reference voltage selector 237 may output the fourth divided voltage signal V4 as the second internal voltage signal VREF2 when only the signal SEL<4> among the first selection signals SEL<1:4> has a logic "high" level. That is, the reference voltage controller 23 may amplify a voltage difference between the first internal voltage signal VREF1 and the input division voltage signal VDIV and may trim the amplified voltage level according to the first selection signals SEL<1:4> to generate the second internal voltage signal VREF2. Thus, the reference voltage controller 23 may act as a differential amplifier to reduce noise components, for example, static electricity included in the first internal voltage signal VREF1. Further, the reference voltage controller 23 may include the reference voltage selector 237 to generate the second internal voltage signal VREF2 whose level is trimmed in response to the first selection signals SEL<1:4>. As a result, the signal receiver circuit including the reference voltage controller 23 as set forth above may reduce noises to generate the internal reference voltage signal IVREF having a stable level, and the level of the internal reference voltage signal IVREF may be more readily controlled without any design modifications or changes.

Figure 4:
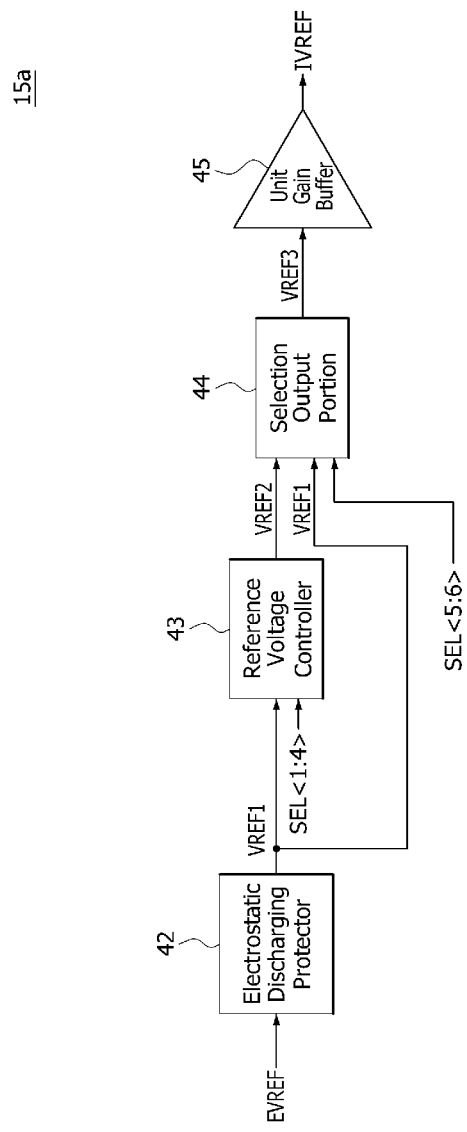
FIG. 4 is a block diagram illustrating another example of an internal reference voltage generator included in the signal receiver circuit of FIG. 1.

Referring to FIG. 4, the internal reference voltage generator 15a may be configured to include an electrostatic discharging protector 42, a reference voltage controller 43, a selection output portion 44 and a unit gain buffer 45. The electrostatic discharging protector 42 acting as an input protection circuit may reduce the static electricity created by the external reference voltage signal EVREF and generate the first internal voltage signal VREF1. When the external reference voltage signal EVREF does not create the static electricity, the electrostatic discharging protector 42 may output the external reference voltage signal EVREF as the first internal voltage signal VREF1. The reference voltage controller 43 may amplify the first internal voltage signal VREF1 in response to the first selection signals SEL<1:4>. In an embodiment of the present invention, the reference voltage controller 43 may generate a plurality of voltage signals internally and output one of the plurality of the voltage signals as the second internal voltage signal VREF2. The selection output portion 44 may output one of the first and second internal voltage signals VREF1 and VREF2 as the third internal voltage signal VREF3 in response to the second selection signals SEL<5:6>. The unit gain buffer 45 may buffer the third internal voltage signal VREF3 to output the internal reference voltage signal IVREF. Unlike the internal reference voltage generator 15 of FIG. 2 which is configured such that an output signal of the unit gain buffer 24 is inputted to the selection output portion 25, the internal reference voltage generator 15a of FIG. 4 is configured such that an output signal of the selection output portion 44 is inputted to the unit gain buffer 45. The reference voltage controller 43 may have substantially the same configuration and operation as the reference voltage controller 23 illustrated in FIG. 3. Thus, a detailed description to the reference voltage controller 43 will be omitted to avoid duplicate explanation.

Figure 5:
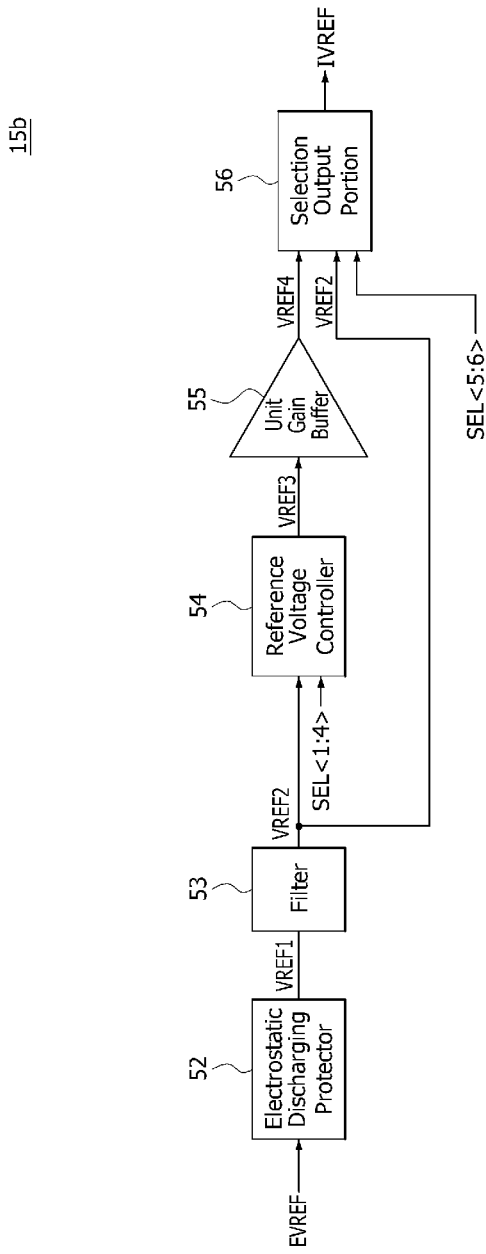
FIG. 5 is a block diagram illustrating still another example of an internal reference voltage generator included in the signal receiver circuit of FIG. 1.

Referring to FIG. 5, the internal reference voltage generator 15b may be configured to include an electrostatic discharging protector 52, a filter 53, a reference voltage controller 54, a unit gain buffer 55 and a selection output portion 56. The electrostatic discharging protector 52 acting as an input protection circuit may reduce the static electricity created by the external reference voltage signal EVREF and generate the first internal voltage signal VREF1. When the external reference voltage signal EVREF does not create the static electricity, the electrostatic discharging protector 52 may output the external reference voltage signal EVREF as the first internal voltage signal VREF1. The filter 53 may reduce unwanted frequency components of the first internal voltage signal VREF1 to generate the second internal voltage signal VREF2. The reference voltage controller 54 may amplify the second internal voltage signal VREF2 in response to the first selection signals SEL<1:4>. In an embodiment of the present invention, the reference voltage controller 54 may generate a plurality of voltage signals internally and output one of the plurality of the voltage signals as the third internal voltage signal VREF3. The unit gain buffer 55 may buffer the third internal voltage signal VREF3 to output a fourth internal voltage signal VREF4. The selection output portion 56 may output one of the second and fourth internal voltage signals VREF2 and VREF4 as the internal reference voltage signal IVREF in response to the second selection signals SEL<5:6>. In an embodiment of the present invention, the internal reference voltage generator 15b may include the filter 53. Thus, the internal reference voltage generator 15b may selectively reduce a predetermined range of frequency component to generate the internal reference voltage signal IVREF. The reference voltage controller 54 may have substantially the same configuration and operation as the reference voltage controller 23 illustrated in FIG. 3. Thus, a detailed description to the reference voltage controller 54 will be omitted to avoid duplicate explanation.

Figure 6:
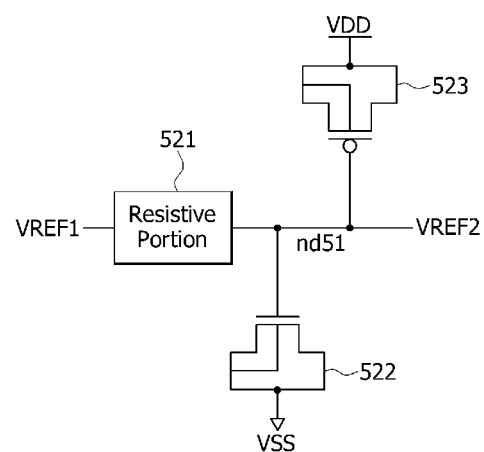
FIG. 6 is a schematic circuit diagram illustrating an example of a filter included in the internal reference voltage generator of FIG. 5.

Referring to FIG. 6, the filter 53 may be configured to include a resistive portion 521, a capacitor 522 coupled to a node ND51 and the ground voltage terminal VSS, and a capacitor 523 coupled to the node ND51 and the power supply voltage terminal VDD. The node ND51 may be electrically connected to an output terminal of the resistive portion 521. The first internal voltage signal VREF1 may be applied to an input terminal of the resistive portion 521, and the second internal voltage signal VREF2 may be outputted through the node ND51. As such, the filter 53 may act as an RC filter including a resistive component of the resistive portion 521 and a capacitive component of the capacitors 522 and 523, thereby reducing a high frequency component included in the first internal voltage signal VREF1.

Figure 7:
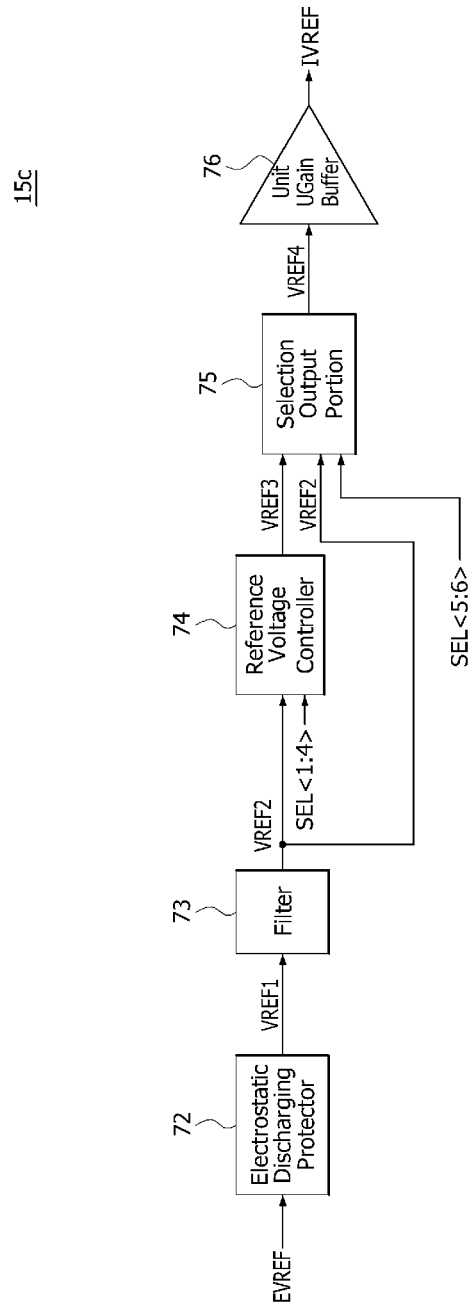
FIG. 7 is a block diagram illustrating yet another example of an internal reference voltage generator included in the signal receiver circuit of FIG. 1.

Referring to FIG. 7, the internal reference voltage generator 15c may be configured to include an electrostatic discharging protector 72, a filter 73, a reference voltage controller 74, a selection output portion 75 and a unit gain buffer 76. The electrostatic discharging protector 72 acting as an input protection circuit may reduce the static electricity created by the external reference voltage signal EVREF and generate the first internal voltage signal VREF1. When the external reference voltage signal EVREF does not create the static electricity, the electrostatic discharging protector 72 may output the external reference voltage signal EVREF as the first internal voltage signal VREF1. The filter 73 may reduce unwanted frequency components of the first internal voltage signal VREF1 to generate the second internal voltage signal VREF2. The reference voltage controller 74 may amplify the second internal voltage signal VREF2 in response to the first selection signals SEL<1:4>. In an embodiment of the present invention, the reference voltage controller 74 may generate a plurality of voltage signals internally and output one of the plurality of the voltage signals as the third internal voltage signal VREF3. The selection output portion 75 may output one of the second and third internal voltage signals VREF2 and VREF3 as the fourth internal voltage signal VREF4 in response to the second selection signals SEL<5:6>. The unit gain buffer 76 may buffer the fourth internal voltage signal VREF4 to output the internal reference voltage signal IVREF. The internal reference voltage generator 15c may include the filter 73. Thus, the internal reference voltage generator 15c may selectively reduce a predetermined range of frequency component to generate the internal reference voltage signal IVREF. The reference voltage controller 74 may have substantially the same configuration and operation as the reference voltage controller 23 illustrated in FIG. 3. Thus, a detailed description to the reference voltage controller 74 will be omitted to avoid duplicate explanation.

As described above, the signal receiver circuit according to an embodiment of the present invention may execute a differential amplifying operation and a buffering operation using the internal reference voltage generator 15, 15a, 15b or 15c, thereby removing noises such as static electricity of an input signal and generating the internal reference voltage signal IVREF having a stable level. Further, the signal receiver circuit according to an embodiment of the present invention may provide a test mode that can trim a level of the internal reference voltage signal IVREF. Hence, the level of the internal reference voltage signal IVREF may be more readily controlled without any design modifications or changes. Moreover, the signal receiver circuit according to an embodiment of the present invention may reduce a high frequency component of an input signal using a filter to generate the internal reference voltage signal IVREF having a stable level.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A signal receiver circuit comprising:
a selection signal generator configured to generate first and second selection signals in response to at least one of an electrical open/short state of a fuse and test mode signals; an internal reference voltage generator configured to amplify an external reference voltage signal after reducing static electricity created by the external reference voltage signal to generate a plurality of internal voltage signals and configured to generate an internal reference voltage signal using the plurality of internal voltage signals in response to the first and second selection signals; and
a buffer configured to buffer an internal signal in response to the internal reference voltage signal to generate a control signal for controlling an internal circuit,
wherein the external reference voltage signal is inputted from an external device for determining a logic level of the internal signal, and
wherein the internal reference voltage generator includes:
a voltage divider configured to divide a voltage level of an internal node to generate the divided voltage signals and an input division voltage signal;
a driver configured to drive a level of the internal node in response to a pull-up signal generated according to a comparison result of the input division voltage signal and the first internal voltage signal; and
a reference voltage selector configured to output one of the divided voltage signals as the second internal voltage signal in response to the first selection signal,
a reference voltage controller configured to amplify the second internal voltage signal to generate at least two divided voltage signals and configured to output one of the divided voltage signals as a third internal voltage signal in response to the first selection signal.

2. The signal receiver circuit of claim 1, wherein the selection signal generator decodes the test mode signals to generate the first and second selection signals during a test mode and generate the first and second selection signals according to an electrical open/short state of a fuse when the test mode terminates.

3. The signal receiver circuit of claim 1, wherein the internal reference voltage generator includes:

an electrostatic discharging protector configured to reduce the static electricity created by the external reference voltage signal to generate a first internal voltage signal.

4. The signal receiver circuit of claim 1, wherein the reference voltage controller further includes:
a signal input portion configured to receive the input division voltage signal and the first internal voltage signal to generate the pull-up signal;
a current supplier configured to supply a current to the signal input portion; and
a current discharger configured to discharge the current supplied to the signal input portion.

5. The signal receiver circuit of claim 1, wherein the internal reference voltage generator further includes:
a unit gain buffer configured to buffer the second internal voltage signal to generate a third internal voltage signal; and
a selection output portion configured to output one of the first and third internal voltage signals as the internal reference voltage signal in response to the second selection signal.

6. The signal receiver circuit of claim 1, wherein the internal reference voltage generator further includes:
a selection output portion configured to output one of the first and second internal voltage signals as a third internal voltage signal in response to the second selection signal; and
a unit gain buffer configured to buffer the third internal voltage signal to output the internal reference voltage signal.

7. A signal receiver circuit comprising:
a selection signal generator configured to generate first and second selection signals in response to at least one of an electrical open/short state of a fuse and test mode signals;
an internal reference voltage generator configured to amplify an external reference voltage signal after reducing static electricity created by the external reference voltage signal to generate a plurality of internal voltage signals and
configured to generate an internal reference voltage signal using the plurality of internal voltage signals in response to the first and second selection signals; and
a buffer configured to buffer an internal signal in response to the internal reference voltage signal to generate a control signal for controlling an internal circuit,
wherein the external reference voltage signal is inputted from an external device for determining a logic level of the internal signal, and
wherein the internal reference voltage generator includes:
an electrostatic discharging protector configured to reduce the static electricity created by the external reference voltage signal to generate a first internal voltage signal;
a filter configured to reduce unwanted frequency components of the first internal voltage signal to generate a second internal voltage signal; and
a reference voltage controller configured to amplify the second internal voltage signal to generate at least two divided voltage signals and configured to output one of the divided voltage signals as a third internal voltage signal in response to the first selection signal.

8. The signal receiver circuit of claim 7, wherein the filter is configured to reduce a high frequency component included in the first internal voltage signal to generate the second internal voltage signal.

9. The signal receiver circuit of claim 7, wherein the reference voltage controller includes:

a voltage divider configured to divide a voltage level of an internal node to generate the divided voltage signals and an input division voltage signal;

a driver configured to drive a level of the internal node in response to a pull-up signal generated according to a comparison result of the input division voltage signal and the second internal voltage signal; and a reference voltage selector configured to output one of the divided voltage signals as the third internal voltage signal in response to the first selection signal.

10. The signal receiver circuit of claim 9, wherein the reference voltage controller further includes:

a signal input portion configured to receive the input division voltage signal and the second internal voltage signal to generate the pull-up signal;

a current supplier configured to supply a current to the signal input portion; and a current discharger configured to discharge the current supplied to the signal input portion.

11. The signal receiver circuit of claim 7, wherein the internal reference voltage generator further includes:

a unit gain buffer configured to buffer the third internal voltage signal to generate a fourth internal voltage signal; and a selection output portion configured to output one of the second and fourth internal voltage signals as the internal reference voltage signal in response to the second selection signal.

12. The signal receiver circuit of claim 7, wherein the internal reference voltage generator further includes:

a selection output portion configured to output one of the second and third internal voltage signals as a fourth third internal voltage signal in response to the second selection signal; and a unit gain buffer configured to buffer the fourth internal voltage signal to output the internal reference voltage signal.

13. A signal receiver circuit comprising:

an electrostatic discharging protector configured to reduce static electricity created by an external reference voltage signal to generate a first internal voltage signal;

a reference voltage controller configured to amplify the first internal voltage signal to generate at least two divided voltage signals and configured to output one of the divided voltage signals as a second internal voltage signal in response to a first selection signal;

a unit gain buffer configured to buffer the second internal voltage signal to generate a third internal voltage signal;

a selection output portion configured to output one of the first and third internal voltage signals as an internal reference voltage signal in response to a second selection signal;

a buffer configured to buffer an internal signal in response to the internal reference voltage signal to generate a control signal for controlling an internal circuit;

and a filter configured to reduce a high frequency component included in the first internal voltage signal, wherein an output signal of the filter is applied to an input terminal of the reference voltage controller.

14. The signal receiver circuit of claim 13, wherein the reference voltage controller includes:

a voltage divider configured to divide a voltage level of an internal node to generate the divided voltage signals and an input division voltage signal;

a driver configured to drive a level of the internal node in response to a pull-up signal generated according to a comparison result of the input division voltage signal and the first internal voltage signal; and a reference voltage selector configured to output one of the divided voltage signals as the second internal voltage signal in response to the first selection signal.

15. The signal receiver circuit of claim 13, wherein the first and second selection signals is generated by decoding test mode signals during a test mode and by controlling an electrical open/short state of a fuse when the test mode terminates.

16. A signal receiver circuit comprising:

an internal signal generator configured to generate an internal signal in response to an external signal;

an electrostatic discharging protector configured to reduce static electricity created by an external reference voltage signal to generate a first internal voltage signal;

a reference voltage controller configured to amplify the first internal voltage signal to generate at least two divided voltage signals and configured to output one of the divided voltage signals as a second internal voltage signal in response to a first selection signal;

a selection output portion configured to output one of the first and second internal voltage signals as a third internal voltage signal in response to a second selection signal;

a unit gain buffer configured to buffer the third internal voltage signal to generate an internal reference voltage signal;

a buffer configured to generate a control signal for controlling an internal circuit in response to the internal signal and the internal reference voltage signal; and a filter configured to reduce a high frequency component included in the first internal voltage signal, wherein an output signal of the filter is applied to an input terminal of the reference voltage controller.

17. The signal receiver circuit of claim 16, wherein the reference voltage controller includes:

a voltage divider configured to divide a voltage level of an internal node to generate the at least two divided voltage signals and an input division voltage signal;

a driver configured to drive a level of the internal node in response to a pull-up signal generated according to a comparison result of the input division voltage signal and the first internal voltage signal; and a reference voltage selector configured to output one of the atleast two divided voltage signals as the second internal voltage signal in response to the first selection signal.

* * * * *